(12) United States Patent
Mukherjee

(10) Patent No.: US 6,649,309 B2
(45) Date of Patent: Nov. 18, 2003

(54) METHOD FOR CORRECTING OPTICAL PROXIMITY EFFECTS IN A LITHOGRAPHIC PROCESS USING THE RADIUS OF CURVATURE OF SHAPES ON A MASK

(75) Inventor: Maharaj Mukherjee, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 09/898,201

(22) Filed: Jul. 3, 2001

(65) Prior Publication Data

US 2003/0008215 A1 Jan. 9, 2003

(51) Int. Cl.$^7$ ................................................. G03F 9/00
(52) U.S. Cl. ........................................................... 430/5
(58) Field of Search ............................ 430/5, 322, 30, 430/394; 382/144

(56) References Cited

U.S. PATENT DOCUMENTS 6,373,975 B1 * 4/2002 Bula et al. .................. 382/144

\* cited by examiner

Primary Examiner—S. Rosasco
(74) Attorney, Agent, or Firm—H. Daniel Schnurmann

(57) ABSTRACT

A method for correcting proximity effects on a mask used in a lithographic process is described. Proximity effects are recognized to be low-pass filter in nature and full advantage of this fact is taken. Shapes having a high radius of curvature are replaced with mask patterns having smaller radii of curvature, rendering the image less susceptible to low-pass filtering effects while achieving a high fidelity printing on the mask. This approach provides better control to the mask designer to handle critical dimensions of the shapes on the mask. The method for correcting proximity effects on a mask includes the steps of providing at least one curved shape to approximate the contour of a polygon on the mask, the polygon controlling the contour of the a least one curved shape; defining the curved shape by way of a plurality of radii of curvature; assigning to each side of the polygon one of the radii of curvature; modifying the radius of curvature at each of the sides of the polygon until each of the radii of curvature reaches the maximum allowable limit for that side, the maximum allowable limit being determined from stored values of radii of curvature corresponding to a plurality of predetermined curved shapes; and combining respective curved shapes assigned to adjacent polygon sides to form a resultant closed curved shape.

12 Claims, 9 Drawing Sheets

METHOD FOR CORRECTING OPTICAL PROXIMITY EFFECTS IN A LITHOGRAPHIC PROCESS USING THE RADIUS OF CURVATURE OF SHAPES ON A MASK

FIELD OF THE INVENTION

This invention is generally related to a lithographic process, and more particularly to a method for correcting optical proximity effects using the radius of curvature of shapes imprinted on a mask.

BACKGROUND OF THE INVENTION

The advent of advanced lithographic techniques and the attempt of chip manufacturers to closely follow Moore's law predicting an exponential growth of number of components on a chip and their shrinkage on the wafer is making the process of designing tools for automating the chip design extremely challenging. The chip is imprinted by means of optical lithographic techniques on the silicon wafer by way of chrome on glass masks. As the components on the chip become smaller, they are now on the verge of reaching the limits of capacity of the lithographic process. The non-linearities associated with this lithographic process of imprinting and the laws of physics associated with light (including diffraction of light waves) makes impressing highly unpredictable. For instance, rectangles are foreshortened into elliptical-shapes, right angles are rounded, and the width of the shapes shrinks. In addition to the non-linearity associated with the optical effects, the process of developing after exposing the wafer and the photo-resist thereon also adds to the uncertainty associated with the critical dimensions of the features. Other effects mainly related to the exposure and development effect associated with the resist exist that contribute to the distortions. The combination of these effects are known as optical proximity effects.

To counter the problem of optical proximity, mask designers intentionally and systematically distort the original shapes on the mask. The net result of these distortions is that the imprinted shape on the wafer ultimately looks like the target or intended images, satisfying the design rules that were created to increase the yield in chip manufacturing. These methods are generally referred to as optical proximity corrections (OPC) and can be categorized into three classes:

Ad-hoc Method: This method is almost as old as manufacturing VLSI chips. Early designers modified existing methods by putting 'flares' and 'hammer heads' at the end of lines and 'serifs' at the rectangular corners to compensate for 'line-end shortening' and 'corner-rounding' due to process irregularities. Since at this stage the size of the features is still large compared to the wavelength of the light used in the lithographic process, the optical proximity does not contribute significantly to the total error budget of the chip manufacturing. However, as the size of the features continuously shrinks, mask designers have continuously readapted earlier techniques to obtain the desired results. Therefore, though prevalent in the early part of the history of optical proximity effect corrections, there is not record of any further development regarding this tool.

Rules Based Method: This method is an initial attempt to formalize the above ad-hoc method. It was observed by chip designers that any compensation required by a particular shape on the wafer is dependent on neighboring shapes, e.g., an isolated line requires more compensation than a set of dense lines. The rules-based method formalizes this notion in a quantitative way. For example, a chip designer may use the tool to decide what the dimensions of a 'hammer-head' added to compensate for line-end shortening should be or what 'corner-serifs' compensate for corner-rounding. These dimensions can be applied as a function of certain rules as, for instance, those that depend on those of the particular shape to which it is applied, the distance to the neighbors, and the dimensions of the neighbors.

Model Based Method: This method emulates the physical and optical effects that are mostly responsible for shape deformations. At the heart of these methods is a computer simulation program that, given the appropriate optical and physical parameters and the original dimension of the object on the mask, predicts with a certain degree of accuracy the printed dimension of the object on the wafer. In the correction phase of the optical proximity effects, the shape on the mask is iteratively modified so that the output result closely approximates what is desired. Finally, this method deforms existing shapes to achieve the target dimensions.

OBJECTS OF THE INVENTION

Accordingly, it is an object of the present invention to correct the problems caused by optical proximity effects in a lithographic process.

It is another object to recognize that optical proximity effects are low-pass filter in nature and to take full advantage of this recognition by better controlling the critical dimensions of the shapes on a mask.

It is still another object to make image less susceptible to low-pass filtering effects and make it possible to achieve a high fidelity printing on the mask.

It is yet another object to replace all the sides or vertices of each shape on the mask having a high radius of curvature with mask patterns having a smaller radius of curvature.

SUMMARY OF THE INVENTION

These and other objects of the invention are achieved by providing a method for correcting proximity effects on a mask used in a lithographic process that includes the steps of: providing at least one curved shape to approximate the contour of a polygon on the mask, the polygon controlling the contour of the at least one curved shape; defining the curved shape by way of a plurality of radii of curvature; assigning to each side of the polygon one of the radii of curvature; and modifying the radius of curvature at each of the sides of the polygon until each of the radius of curvature reaches the maximum allowable limit for the side, this maximum allowable limit being determined from stored values of radii of curvature corresponding to a plurality of predetermined curved shapes.

The radius of curvature of each of the sides of the polygon is determined by the low pass filter effect of the lithographic process, wherein the low pass filter effect eliminates the high frequency components associated with the vertices (or sides) forming the polygon.

In another aspect of the invention there is provided a method for correcting proximity effects on a mask used in a lithographic process, that includes the steps of: providing a predetermined polygon of the mask; assigning a curved segment for each side of the predetermined polygon; measuring the radius of curvature of each of the curved segments; mapping the radius of curvature to each side of the polygon; modifying the radius of curvature at each arc of the curve until the radius of curvature respectively reaches a predetermined limit for the arc; and forming a closed shape that approximates the predetermined polygon by joining the curves corresponding to adjacent sides of the predetermined polygon.

The closed curved shapes thus obtained is approximated by linear segments having an orthogonal (i.e., parallel to either the x or y axis), or orthogonal-45 (i.e., parallel to 45 or 135 degree lines) orientation, hereinafter referred to as Ortho and Ortho-45.

Unlike conventional methods, e.g., the 'rules based method', the present method incorporates the model effects in the process, and unlike the model based effect, the invention is non-iterative and, hence, much faster.

BRIEF DESCRIPTION OF THE DRAWINGS

The features of the invention believed to be novel and the steps characteristic of the invention are set forth with particularity in the appended claims. The figures are for illustrative purposes only and are not drawn to scale. The invention, however, both as to organization and method of operation, may best be understood by reference to the detailed description which follows taken in conjunction with the accompanying drawings.

DETAILED DESCRIPTION OF THE INVENTION

Figure 1:
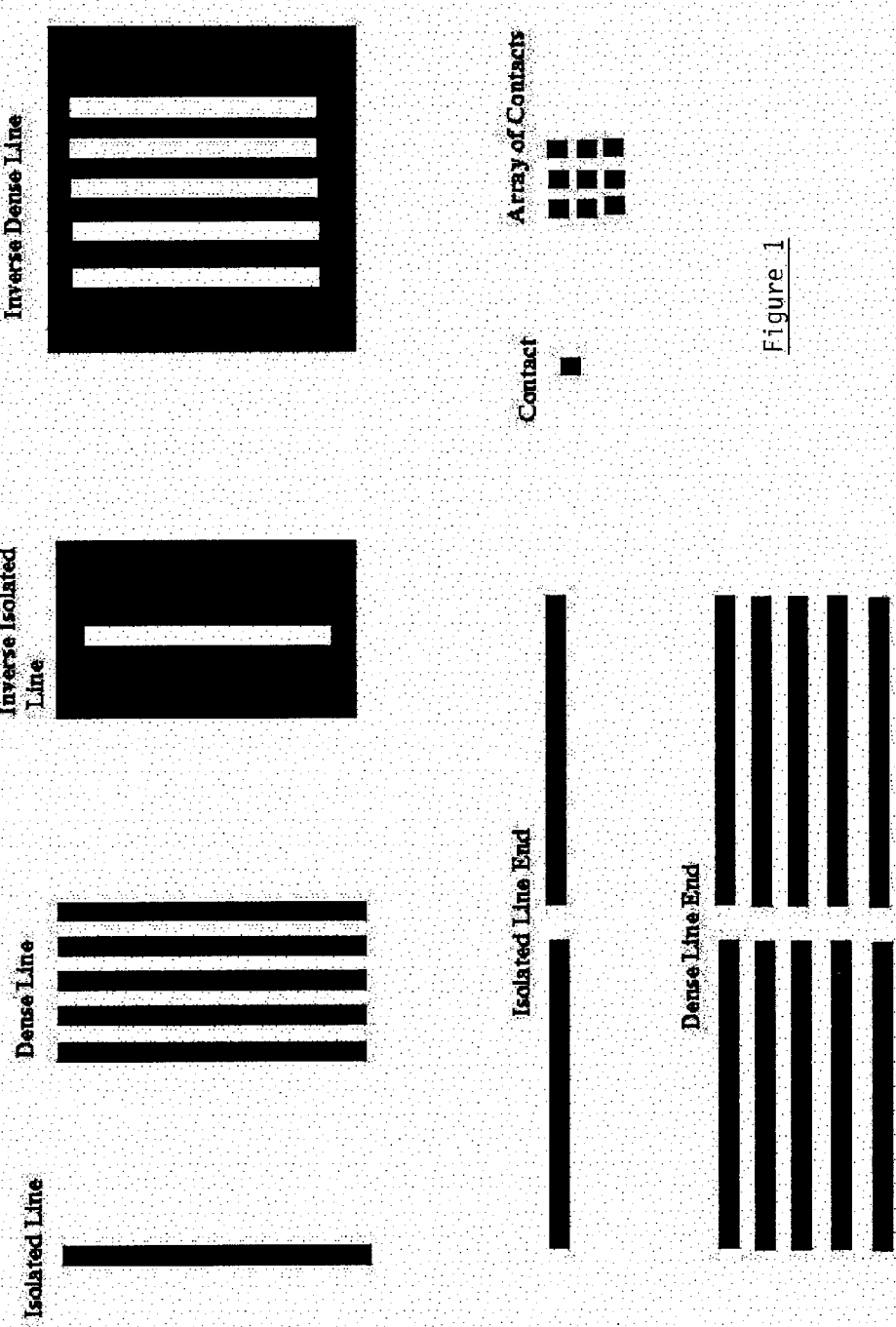
FIG. 1 shows conventional design mask patterns, e.g., isolated lines, dense lines, inverted isolated lines, contacts, line ends and dense line ends.

The main concept of the present invention stems from the fact that optical proximity effects (that include both the optical and the process of resist exposure and developing) act as a low pass filter on the image. The low-pass filtering effect of the lithographic process for an image eliminates sharp changes and keeps only the smoother portions. For instance, a rectangular image has four right angle corners; when passing through a low-pass filter, a curve smooths its sharp corners.

Low-pass filtering effect can also be explained in terms of spatial frequency. The sharper the change of radius in the curve, the higher its spatial frequency. A change in slope of a right angle translates into a spatial frequency of infinity. The low-pass filter eliminates the high-frequency components, allowing only the low frequency component to pass through and be printed on the wafer. Thus, corners (e.g., of a Manhattan geometry of a mask) become rounded because the spatial frequency of a right angled corner of the image is infinity. Accordingly, any part of the image having a high radius of curvature becomes subject to such filtering effects. Consequently, lines are substantially shorter and the spatial frequency at the end of the line is infinite.

In a lithographic process for printing images on a wafer, information flows in a series of operations that includes:

1. Design
2. Mask
3. Optical Image
4. Resist Image
5. Etched Image
6. Device Layer on the final wafer.

Transferring the information of the design through each step of the process distorts the image and creates significant changes in the design characteristics which affect the yield. The process of the mask making described in Step 2 shows the optical process to be affected by the non-linearity of light similar to the optical proximity effect of the lithographic process. However, distortions are smaller since the dimensions of the shapes on the mask are significantly larger than those of the wafer. This step advantageously incorporates the low-pass filtering effect described above. In Step 3, the wafer is exposed to light through the mask. This process displays the non-linearities and low-pass filtering effects. The next step (Step 4) consists in developing the resist, i.e., a chemical process displaying the low-pass filtering effect. In Step 5, depending on the style and type of etch (wet, or dry; electron-beam or ion), there is a further reduction of the sharpness of the image (i.e., another low-pass filtering effect), a step that eventually leads to the devices on the wafer.

As previously described, a primary aspect of the present invention relates to the optical proximity effects acting as a low pass filter and stemming from the fact that it is not possible to print images having a high frequency content. It becomes then advantageous to create images on a mask that are totally devoid of high frequency components. Using the inventive Optical Proximity Correction Method (OPC), image ends are distorted in a way that makes them devoid of any high frequency components which cannot be printed on the wafer. This is realized by replacing (or distorting) shapes having a high spatial frequency content by shapes with low spatial frequency content. Thus, it becomes necessary to first identify the presence of sharp corners in the shapes having high frequency components. Then, the sharp corners are replaced by smoother curves having a smaller radius of curvature, i.e., with only low-frequency components. Finally, keeping in mind that lithographic masks containing curved shapes are currently difficult to manufacture and inspect, each curved contour of the shape is approximated by another having Ortho (i.e., parallel to either the x or y axis) or Ortho-45 (i.e., parallel to 45 or 135 degree lines) orientation. The resultant Ortho or Ortho-45 shapes closely follow the contour of the curved shapes, minimizing any distortions and making the manufacturing of the curved shapes on the mask feasible. Three steps in the procedure achieve this objective:

Evaluating the Printable Radius of Curvature

The low-pass filtering effect truncates the high frequency components of the image that vary from one type of shape to another and from one position to the next. For example, an isolated shape may require a different low-pass filtering effect than a collection of shapes. The present method, by relying on experimental data, finds the best printable radius of curvature for each type of shape. Generally, patterns are generated by isolated shapes that are positioned in a variety of orientations. After creating these shapes and measuring their allowable radius of curvature, this data is used for generating masks with the above experimental data.

Generating Mask with Limited Radius of Curvature

It is assumed that the mask satisfies all the design rules provided by a designer. It is further assumed that the mask designer provides, in addition, all the critical dimensions for the shapes that are on the mask and tolerable errors on the critical dimensions. A Bezier curve fitting method is preferably used to obtain mask shapes that satisfy the critical dimensions with tolerable errors and allowable radii of curvature for generating the corrected mask shapes.

Approximating Smooth Curves with Ortho and Ortho-45 Sides

Since it is not possible with the current technology to create masks with non-linear shapes, the curves created in the previous step are approximated by Ortho or Ortho-45 interpolations that are best suited for manufacturing and inspecting masks. Practitioners of the art will readily recognize that other orientations are possible, even when these orientations are not as desirable for manufacturing purposes. Each of the above sections will now be described in greater detail with the help of the drawings and flowcharts.

Determination of the Maximum Radius of Curvature

Figure 2:
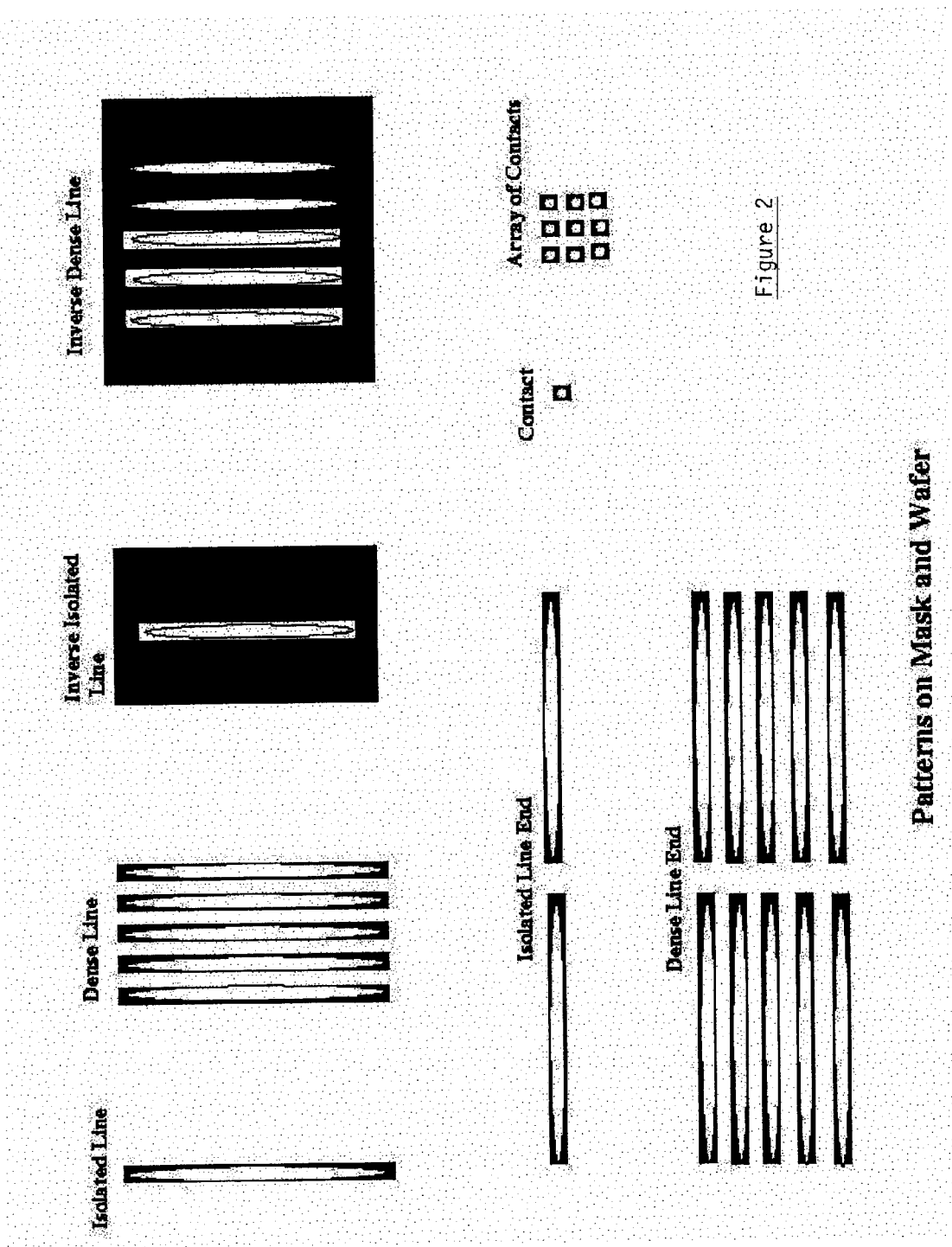
FIG. 2 illustrates the design patterns of FIG. 1 after completing the lithographic process or after a simulation thereof.

With reference to FIGS. 1 and 2, the maximum allowable radius of curvature is computed for a variety of mask types. This step can be viewed as a preprocessing step which is performed only once to collect and store data for further use by the following stages.

The maximum allowable radius of curvature on the chip depends on the chip manufacturing process. It further depends on particular optical conditions, the resist used for the development process and the chemical and etch properties of the development process. The optical properties of interest include the wavelength of light, the numerical aperture, the type of illumination (e.g., standard, annular, quadruple or bipolar), all of which are known in the art. The resist effect includes the type of resist (positive or negative tone), its thickness and contrast. The chemical and the etch properties of the development process include post-exposure baking diffusion, exposure time and etching methods.

The maximum allowable radius of curvature depends on all of the factors listed above. Therefore, it is important to let the mask containing the designed pattern follow the same process with the same optical and process properties as for an actual chip. However, in the present case, the design patterns are simple. A typical set of design patterns consist of those shapes shown in the FIG. 1. These patterns are representative of typical shapes and shape neighborhoods found in a chip:

1. isolated lines
2. dense lines
3. inverse-isolated lines
4. contacts
5. line-ends
6. dense line-ends Shown in FIG. 2 is a process of fabricating a wafer wherein the shapes are distorted. It is known that the low-pass filtering of the lithographic process affects any type of shape. The selected shapes are equivalent to those previously depicted in FIG. 1 along with overlying shapes created by the lithographic process. The lithographic process overlays the original shape for comparison purposes. By way of example, an isolated line is shown in the top left-hand corner of FIG. 1. In FIG. 2, the isolated line along with the curved shape created by the lithographic simulation overlays the isolated line. Similarly, dense lines are overlaid with dense curved shapes, and inverted isolated lines (or an isolated rectangular space within a block) with inverted curved isolated lines.

Figure 3:
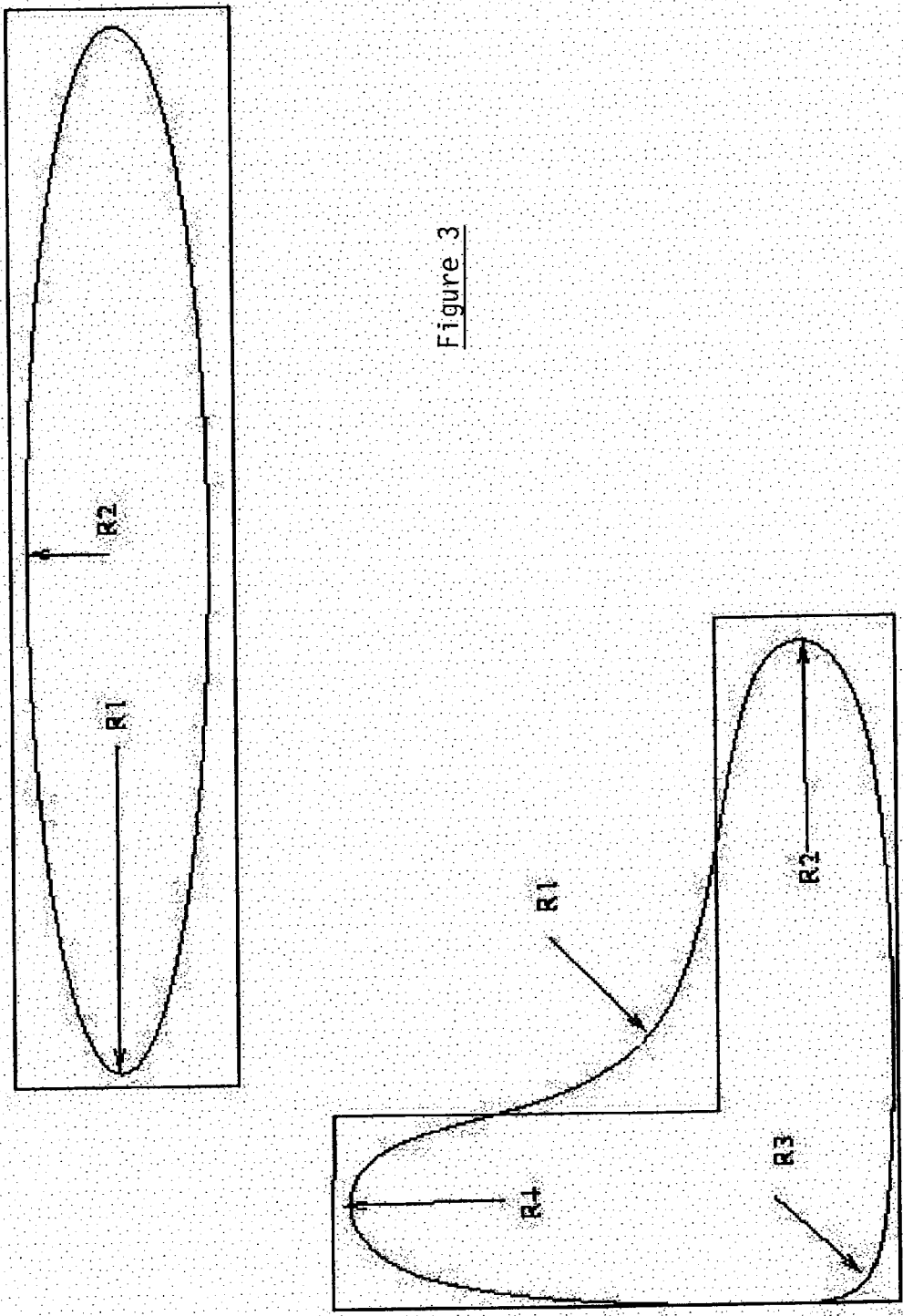
FIG. 3 illustrates various curvatures required for calculating the radius of curvature of a shape (i.e., polygon) under consideration

A closer view of an isolated line and an L-shaped bracket are shown in FIG. 3. The distortions are deliberately enhanced to show the details. The points at which the radius of curvature is to be measured are also illustrated therein. After measuring the radius of curvature, the data is stored in a convenient format for future retrieval. The steps used to store the data at this stage are listed in the flowchart shown in FIG. 4.

The purpose of the flowchart is to create a table made of simple shapes (e.g., as shown in the FIG. 1) to measure the maximum allowable radius of curvature at appropriate points of each shape and filling out a table of values. The latter can be used in the following sections for performing an optical proximity correction on the shapes of a real mask. Therefore, the input to this stage is a mask containing shapes of the type shown in FIG. 1, with appropriate processing parameters that include optical and resist effects. The output is a table comprising the radius of curvature for each of the shapes. It is divided into different sections, with each section devoted to an individual type of shape. Each section stores all the radius of curvature measurements.

1. The first step of the process exposes the mask containing the shapes through predetermined optical and resist conditions and creates the final resulting shapes on the wafer.

2. A measuring device, e.g., a Scanning Electron Microscope, measures the printed radius of curvature at predetermined points of each shape and fills the table. In certain instances, a lithographer may perform the optical and resist steps of the lithographic processing separately. In such a case, two tables are required: one following the optical process and another following the resist process. Steps 1 and 2 are first repeated for the optical process and, then, for the resist process. Moreover, the steps can be either performed exactly or approximated by computer simulation. For model calibration, the above steps are similar to those characteristic of the model based OPC method. Note that the model based method is an iterative method provided with a simulator. At each step of the iteration, the shape is distorted and the resulting shape is simulated to check the amount of correction needed for the next iteration. The simulator requires proper calibration in accordance with the lithographic process used. Otherwise, the corrections are totally erroneous. The only difference between the method and the model based OPC is that the radius of curvature is computed to measure critical distances.

As explained previously, the purpose of this step is to preprocess the data to compute the maximum allowable radius of curvature. Once this information is known, the following two stages are used to perform the optical proximity correction and to enhance the actual sizing. Each shape at the device level is provided with a tolerance of measurable dimensions and is printed "to size" by the lithographic printability of the shapes (i.e., the printed dimensions of the shapes remain within the tolerance levels of the designed dimensions).

Generating Mask with a Limited Radius of Curvature

This step modifies the original shapes on the mask with curves having the maximum radius of curvature obtained from the previous section. Inputs to this step are polygons with straight sides having Ortho or Ortho-45 orientations. The output are the curved shapes. This stage behaves in a manner similar to B-splines (i.e., arcs consisting of one or more segments) commonly used by interactive computer graphics designers. Drawing B-splines or Bezier curves is well known in the art and will not be elaborated further. Each arc segment is characterized by a parameter ranging from 0 to 1. The shape of the curve is defined by control points set by the vertices of the original shape. The control points, when connected by a straight line, are referred to as a control polygon. The number of points defining the segment of the curve determines the order of the polynomial of the curve (i.e., quadratic, cubic, or higher).

Figure 5:
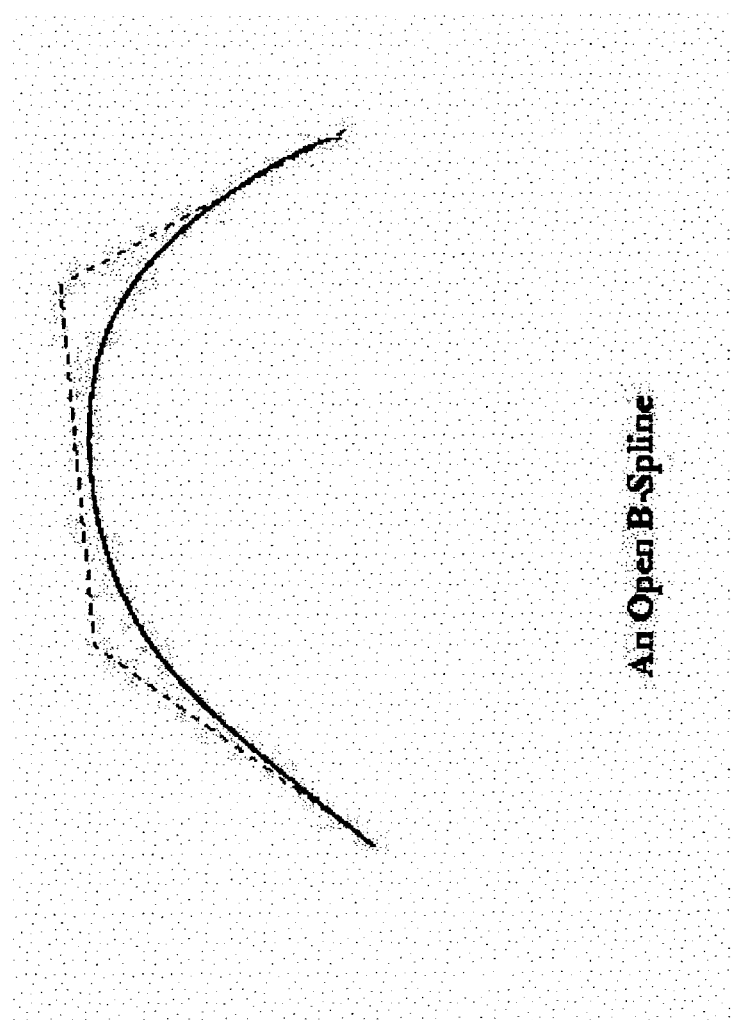
FIG. 5 shows a closed and an open B-spline with the control polygons.
Figure 5:
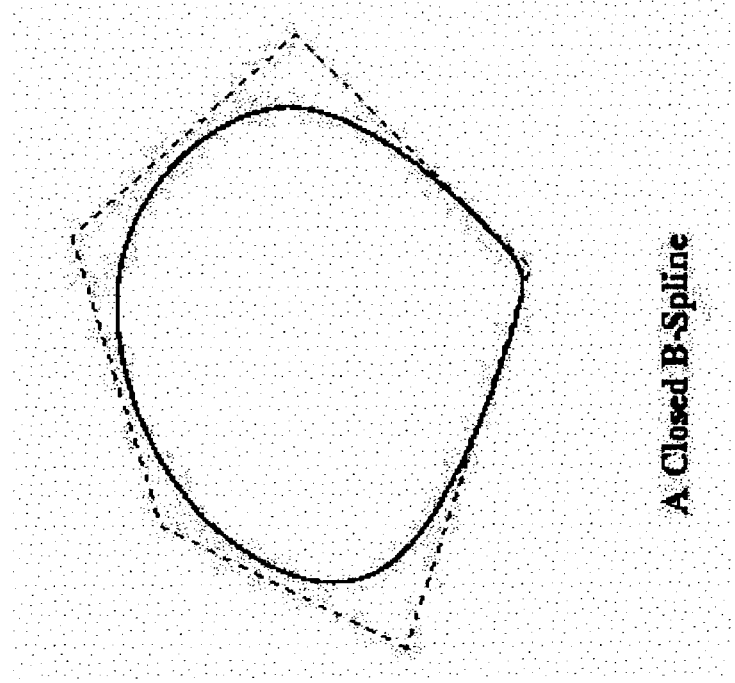

FIG. 5 illustrates how a mask having a closed and open B-spline curve with a limited radius of curvature is generated. Each arc segment is merged with an adjacent arc segment by way of a blending function. The design shapes act as control polygons, with the measurement points dividing the control polygon into segments or sections. A Bezier curve adapted to the control polygon is created to satisfy the radius of curvature that was obtained in the previous step of evaluating the printable radius of curvature.

Generating Ortho-45 Shapes from the Curved Shapes

Since curved shapes on the mask are both difficult to manufacture and inspect, the final shapes on the mask are shaped having straight line sides. Generally, to facilitate the process of inspecting the shapes, their orientation is, preferably, either Ortho or Ortho-45. Alternatively, the input to this stage are curves or B-splines generated in the previous stage. The output to this stage are Ortho or Ortho-45 polygons.

Figure 6:
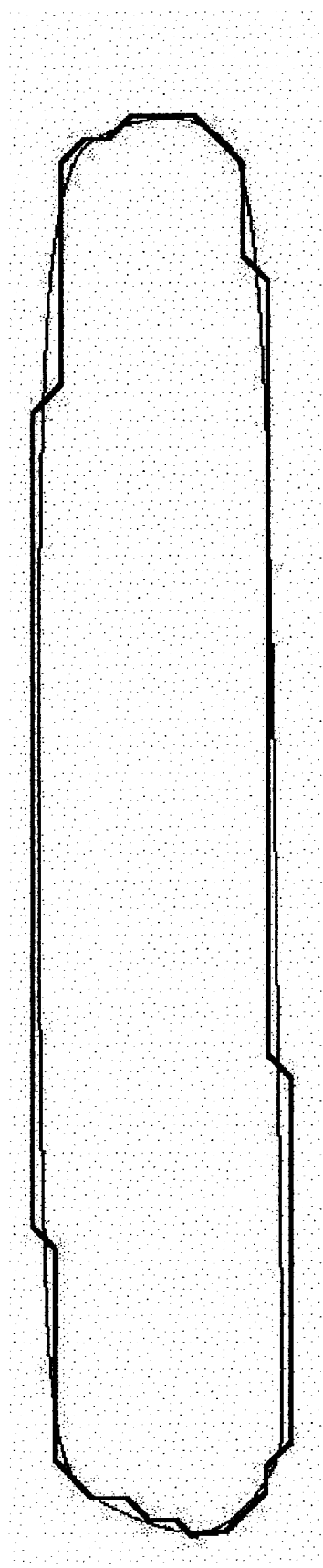
FIG. 6 illustrates a closed B-spline in thin lines, whereas the corresponding Ortho-45 polygon is shown in thick lines.

Several algorithms, referred to as Ortho-45 Cover have been advantageously used to achieve this objective. Therein, a polygonal side is approximated by a staircase-like function. Each side of the staircase is provided with an Ortho or Ortho-45 orientation. [Note: vertices may be used in lieu of sides with equal success]. By way of example and with reference to FIG. 6, the method of approximating smooth curves with Ortho and Ortho-45 sides is applied to a closed B-spline shown as thin lines, whereas the corresponding Ortho-45 polygon is shown in thick lines. The inventive method converts the curved shapes generated in the previous stage into Ortho-45 shapes within the tolerance of manufacturing and inspection tools. The shapes thus generated represent the final output.

The Final Results

Figure 7:
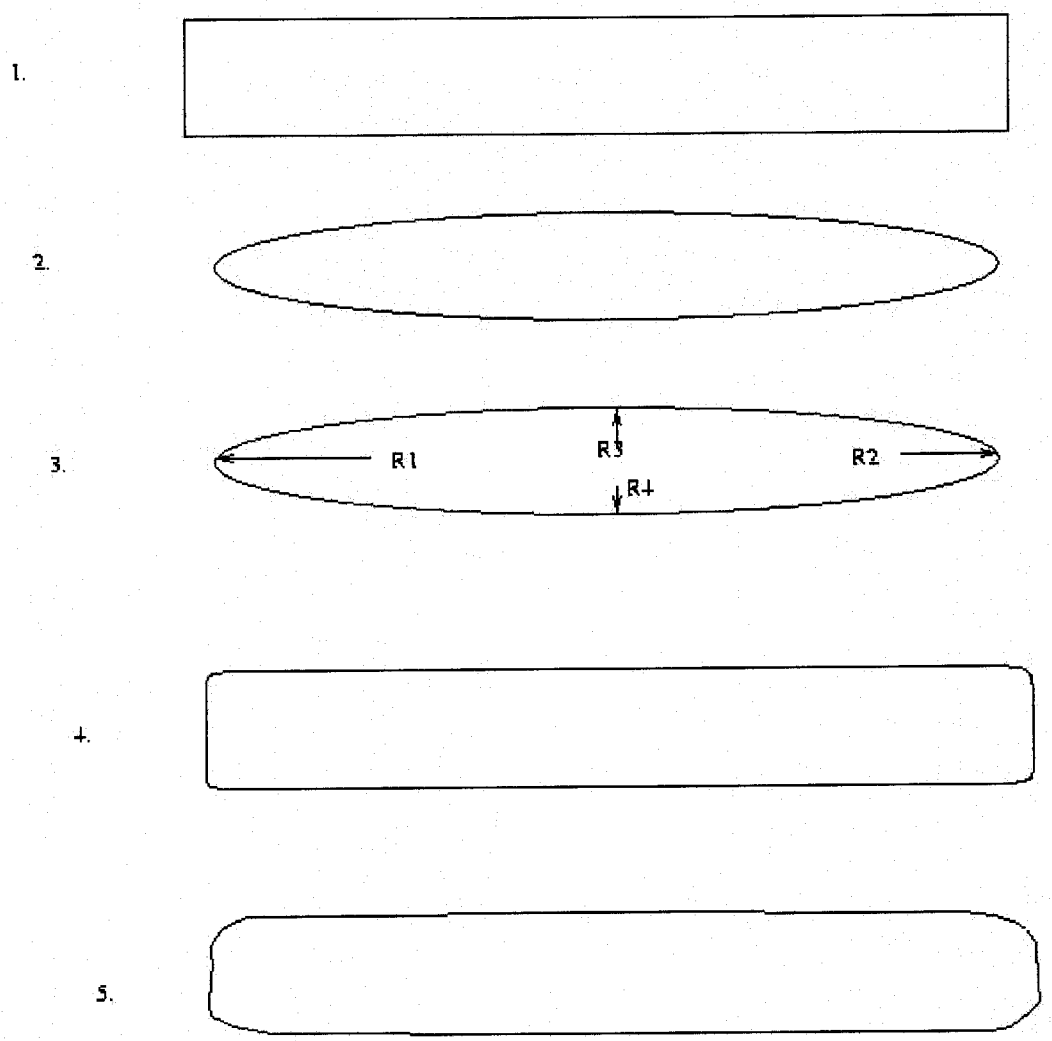
FIGS. 7.1 to 7.2 depict the various stages of the present invention as they apply to an isolated rectangle.
Figure 8:
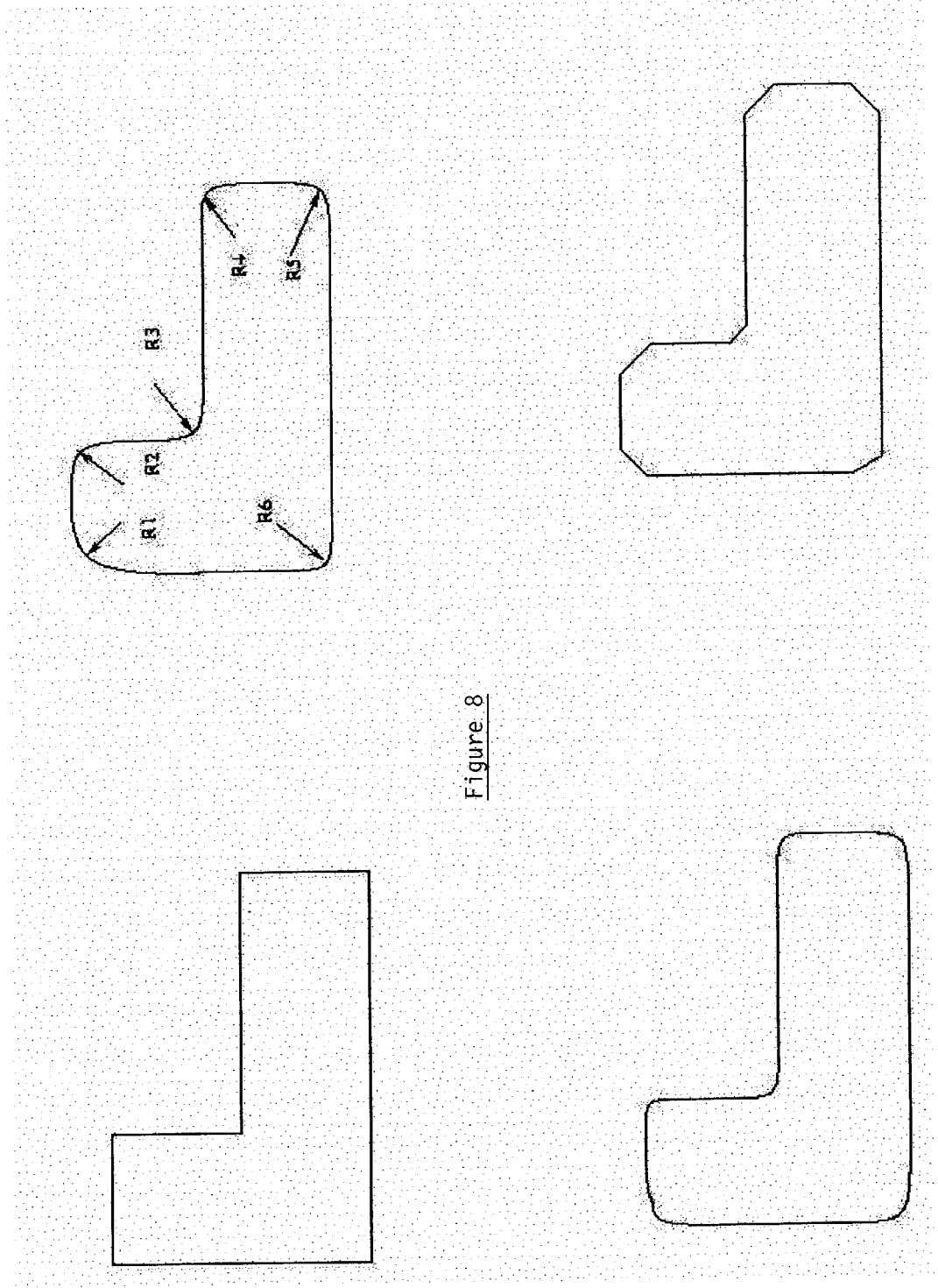
FIGS. 8.1 to 8.2 illustrate the various stages of the present invention applicable to an L-bracket.

Referring to FIGS. 7 and 8, two examples are shown hereinafter to combine the various steps of the present inventive method and summarize the three processes described above. FIG. 7 depicts various steps of the present invention as they apply to an isolated rectangle, and FIG. 8 illustrates the various stages of the present invention applicable to an L-bracket.

EXAMPLE 1

FIGS. 7.1 and 7.2 respectively represents the desired shape or output and the resultant shapes when simulated. The shapes are used to measure the radius of curvature at points R1, R2, R3 and R4 (FIG. 7.3). Next, a Bezier curve unique to the generation of a curved shape is shown (FIG. 7.4). Since this shape is not easily manufacturable, another having only Ortho-45 sides is created (FIG. 7.5).

EXAMPLE 2

Shown in FIGS. 8.1 and 8.2 are, respectively, a shape in the form of an L-shaped bracket and the simulated shape. This shape is used to measure the radius of curvature at points R1, R2, R3, R4, R5 and R6 (FIG. 8.2). The output curve is depicted after using any conventional method for generating a Bezier curve (FIG. 8.3). However, as previously stated, this shape is not easily manufacturable. Accordingly, a new shape is created having only Ortho-45 sides (FIG. 8.4).

Figure 9:
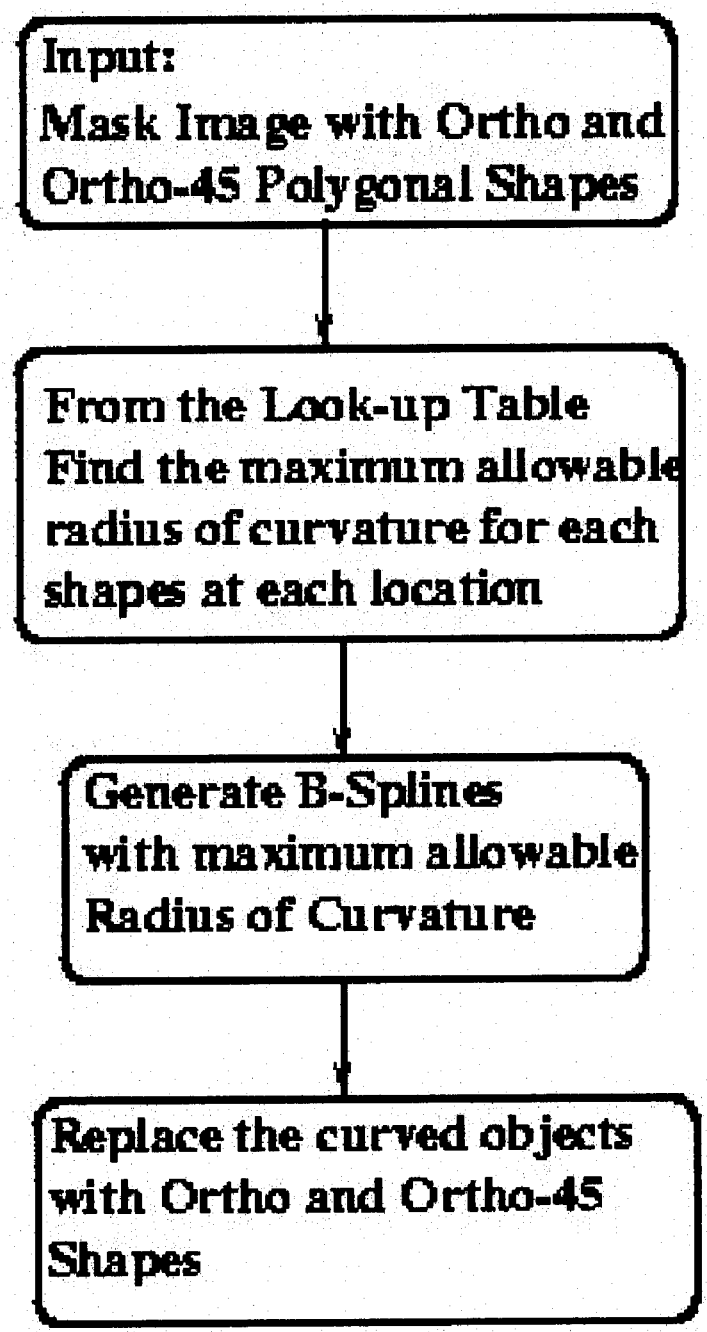
FIG. 9 is a flow chart describing the various steps for calculating the maximum allowable radii of curvature and changing the orientation of the curved shapes to conform to Ortho and Ortho-45 shapes, in accordance with the invention.

The last two stages comprising the optical proximity correction are further described in the flow chart shown in FIG. 9 which includes generating a mask with limited radius of curvature and approximating smooth curves with Ortho and Ortho-45 sides.

Hereinafter is described a step by step description of the algorithm. Note that an input to this flowchart is the actual layout of the designed mask used in conjunction with the table of maximum radius of curvature described with reference to flowchart of FIG. 4. The output of the present flowchart is a set of final shapes of the mask to be manufactured.

Figure 4:
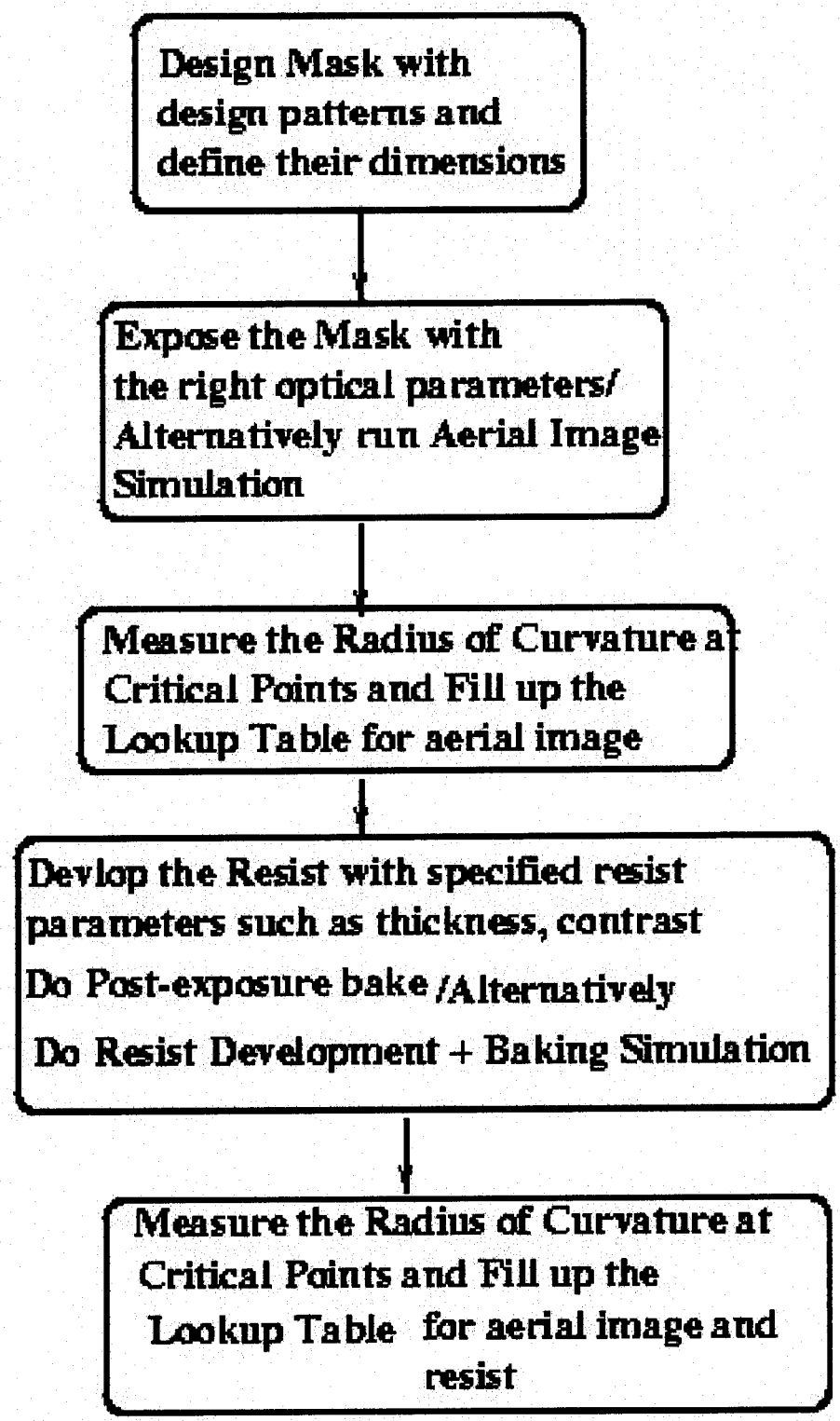
FIG. 4 is a flow chart showing the steps for measuring the radius of curvature, in accordance with the present invention.

The shapes of a manufacturable mask consist of various combinations of simple shapes that were used with reference to the input of the flowchart of FIG. 4. The table created in flowchart of the FIG. 4 assigns the maximum allowable radius of curvature at selected locations of the shapes. Therefore, the input of this step corresponds to the input of the flow chart, viz. the given mask layout and the table containing the radius of curvature for each simple shape at appropriate locations. The output for this step is a mask layout annotated with the given maximum allowable radius of curvature at the appropriate locations.

In the next step, the B-spline method generates curved shapes obeying the maximum radius of curvature at various locations. Thus, the input is the mask layout annotated with the given maximum allowable radius of curvature at the appropriate locations, and the output is a curved shape representing the Ortho or Ortho-45 shapes of the original mask.

In the last step, the input of the curved shapes created previously is converted into Ortho or Ortho-45 shapes. The output of this stage is a set of manufacturable mask shapes.

The present method presents several advantages over the prior art:

The present method recognizes that proximity effects are low-pass filter in nature and takes full advantage of this fact.

The accuracy of the rules-based method depends on the number of neighboring shapes and how detailed the rules are. The inventive method does not suffer from such a limitation.

The inventive method recognizes the maximum allowable radius of curvature as the main determining factor for the 'to-size printability' of shapes on the wafer.

The method provides a simple procedure wherein information gathered on the maximum allowable radius of curvature in a preprocessing stage is used for enhancing the printability of shapes on a wafer.

The present invention can be realized in hardware, software, or a combination of hardware and software. The invention can further be realized in a centralized fashion in one computer system, or in a distributed fashion where different elements are spread across several interconnected computer systems. Any computer system or other apparatus adapted for carrying out the methods described herein is suitable. A typical combination of hardware and software could be a general purpose computer system with a computer program that, when being loaded and executed, controls the computer system such that it carries out the methods described herein. The present invention can also be embedded in a computer program product, which includes all the features enabling the implementation of the methods described herein, and which, when loaded in a computer system, is able to carry out these methods.

It is intended that a computer program means or computer program in the present context be indicative of any expression, in any language, code or notation, of a set of instructions intended to cause a system having an information processing capability to perform a particular function either directly or after conversion to another language, code or notation and/or reproduction in a different material form.

While the invention has been described in conjunction with a specific embodiment, it is to be understood that many alternatives, modifications and variations will be apparent to those skilled in the art in light of the foregoing description. Accordingly, it is intended to embrace all such alternatives, modifications and variations which fall within the spirit and scope of the appended claims. All matters set forth herein or shown in the accompanying drawings are to be interpreted in an illustrative and non-limiting sense.

What is claimed is:

1. A method for correcting proximity errors in a lithographic process comprising the steps of:
    providing at least one curved shape to approximate the contour of a polygon on said mask, said polygon controlling the contour of said at least one curved shape;
    assigning to each side of said polygon at least one edge segment representing the shape of said polygon side;
    forming corners of said polygon by intersection of adjacent and non-colinear sets of said edge segments;
    assigning to each of said edge segments and to each of said corners a radius of curvature;
    assigning to each of said radii of curvature a maximum allowable limit from predetermined minimum and maximum values; and
    iteratively modifying said radii of curvature of each side and corner of said polygon until said maximum allowable limit is reached, wherein said at least one curved shape reaches the shape of the original polygon.

2. The method as recited in claim 1, wherein said maximum and minimum radii of curvature are obtained by lithographic simulation.

3. The method as recited in claim 1, wherein the order of polynomial defining said curved shape defines said maximum allowable radius of curvature.

4. The method as recited in claim 1, wherein said radius of curvature of each of said sides of said polygon is determined by a low pass filter effect of said lithographic process, said low pass filter effect eliminating high frequency components associated with sides forming said polygon.

5. The method as recited in claim 1 further comprising the step of combining respective curved shapes assigned to adjacent ones of said polygon sides to form a resultant closed curved shape.

6. The method as recited in claim 5, wherein said combined curved shapes form a closed curve shape approximating said polygon, said polygon controlling the final shape of said closed curve shape.

7. The method as recited in claim 6, wherein said approximated polygon is created by lithographic simulation.

8. The method as recited in claim 5, wherein said closed curved shape is approximated by linear segments having an orthogonal (Ortho) or orthogonal-45 (Ortho-45) orientation.

9. The method as recited in claim 5, wherein said closed curved shape is approximated by linear segments having any orientation.

10. A method of correcting proximity errors in a lithographic process on a mask comprising the steps of:
    providing at least one polygon on the said mask;
    providing at least one curved shape to approximate the contour of a polygon on said mask, said polygon controlling the contour of said at least one curved shape;
    assigning to each side of said polygon at least one edge segment representing the shape of said polygon side;
    forming corners of said polygon by intersection of adjacent and non-colinear sets of said edge segments;
    assigning to each of said edge segments and to each of said corners a radius of curvature;
    assigning to each of said radius of curvature a maximum allowable limit by providing predetermined minimum and maximum values;
    iteratively modifying said radii of curvature of each side and corner of said polygon until said maximum allowable limit is reached, wherein said at least one curved shape reaches the shape of the original polygon; and
    forming a closed contour that approximates said polygon by joining said curved segments corresponding to adjacent sides of said polygon.

11. The method as recited in claim 10, wherein said approximated polygon is created by lithographic simulation.

12. A program storage device readable by a machine, tangibly embodying a program of instructions executable by the machine to perform method steps for correcting proximity errors of a lithographic process on a mask used in the said lithographic process, said method steps comprising:
    providing at least one curved shape to approximate the contour of a polygon on said mask, said polygon controlling the contour of said at least one curved shape;
    assigning to each side of said polygon at least one edge segment representing the shape of said polygon side;
    forming corners of said polygon by intersection of adjacent and non-colinear sets of said edge segments;
    assigning to each of said edge segments and to each of said corners a radius of curvature;
    assigning to each of said radius of curvature a maximum allowable limit by providing a minimum and a maximum value; and
    iteratively modifying said radii of curvature of each side and corner of said polygon until said maximum allowable limit is reached, wherein said at least one curved shape reaches the shape of the original polygon.

* * * * *